(12) United States Patent
Yin et al.

(10) Patent No.: US 11,804,428 B2
(45) Date of Patent: Oct. 31, 2023

(54) MIXED PAD SIZE AND PAD DESIGN

(71) Applicant: QUALCOMM Incorporated, San Diego, CA (US)

(72) Inventors: Wen Yin, Chandler, AZ (US); Yonghao An, San Diego, CA (US); Manuel Aldrete, Encinitas, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/097,327

(22) Filed: Nov. 13, 2020

(65) Prior Publication Data

US 2022/0157705 A1 May 19, 2022

(51) Int. Cl.
*H01L 21/48* (2006.01)
*H01L 23/498* (2006.01)

(52) U.S. Cl.
CPC .... *H01L 23/49838* (2013.01); *H01L 21/4846* (2013.01); *H01L 23/49816* (2013.01); *H01L 23/49822* (2013.01)

(58) Field of Classification Search
CPC ........... H01L 23/49838; H01L 21/4846; H01L 23/49816; H01L 23/49822
USPC .......................................................... 174/250
See application file for complete search history.

(56) References Cited

U.S. PATENT DOCUMENTS

| 6,787,918 | B1 | 9/2004 | Tsai et al. |
| 2010/0295174 | A1 | 11/2010 | Ozawa et al. |
| 2013/0107483 | A1 | 5/2013 | Jiang et al. |
| 2018/0241859 | A1 | 8/2018 | Cho et al. |
| 2020/0035589 | A1* | 1/2020 | Lee .................. H01L 23/49816 |
| 2020/0251436 | A1* | 8/2020 | Williamson ...... H01L 23/49838 |

OTHER PUBLICATIONS

International Search Report and Written Opinion—PCT/US2021/054406—ISA/EPO—dated Jan. 18, 2022.

* cited by examiner

*Primary Examiner* — Tremesha S Willis
(74) *Attorney, Agent, or Firm* — Muncy, Geissler, Olds & Lowe, P.C.

(57) ABSTRACT

Disclosed is a package and method of forming the package with a mixed pad size. The package includes a first set of pads having a first size and a first pitch, where the first set of pads are solder mask defined (SMD) pads. The package also includes a second set of pads having a second size and a second pitch, where the second set of pads are non-solder mask defined (NSMD) pads.

22 Claims, 7 Drawing Sheets

MIXED PAD SIZE AND PAD DESIGN

FIELD OF DISCLOSURE

This disclosure relates generally to package devices, and more specifically, but not exclusively, to mixed pad size and pad design for devices and fabrication techniques thereof.

BACKGROUND

Integrated circuit technology has achieved great strides in advancing computing power through miniaturization of active components. The flip-chip devices can be found in many electronic devices, including processors, servers, radio frequency (RF) integrated circuits, etc. Flip-chip packaging technology becomes cost-effective in high pin count devices. The flip-chip bonding conventionally uses solder-on-pad (SOP) technology for flip-chip substrates.

Additionally, conventional flip-chip design uses either a uniform bump size across the whole chip or in some designs may define the different bump size based on the die location in digital die designs. Recently more radio frequency (RF) products have moved to flip-chip designs. However, this transition of RF technology has made it difficult for conventional designs to meet new performance demands. For example, RF front end (RFFE) footprint reduction is desired to support more bands for 5G applications. Board level reliability for RFFE devices has been a major challenge as applied to double-sided ball grid array (BGA) packages with limited space for the BGA pattern using a conventional uniform solder mask defined (SMD) BGA pad approach.

Accordingly, there is a need for systems, apparatuses and methods that overcome the deficiencies of conventional package designs and fabrication processes including the methods, systems and apparatuses provided according to the various aspects disclosed herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, at least one aspect includes, an apparatus including a package. The package including a first set of pads having a first size and a first pitch, where the first set of pads are solder mask defined (SMD) pads. The apparatus also includes a second set of pads having a second size and a second pitch, where the second set of pads are non-solder mask defined (NSMD) pads.

In accordance with the various aspects disclosed herein, at least one aspect includes, a method for fabricating a package, the method including: forming a first set of pads having a first size and a first pitch, where the first set of pads are solder mask defined (SMD) pads. The method also includes forming a second set of pads having a second size and a second pitch, where the second set of pads are non-solder mask defined (NSMD) pads.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
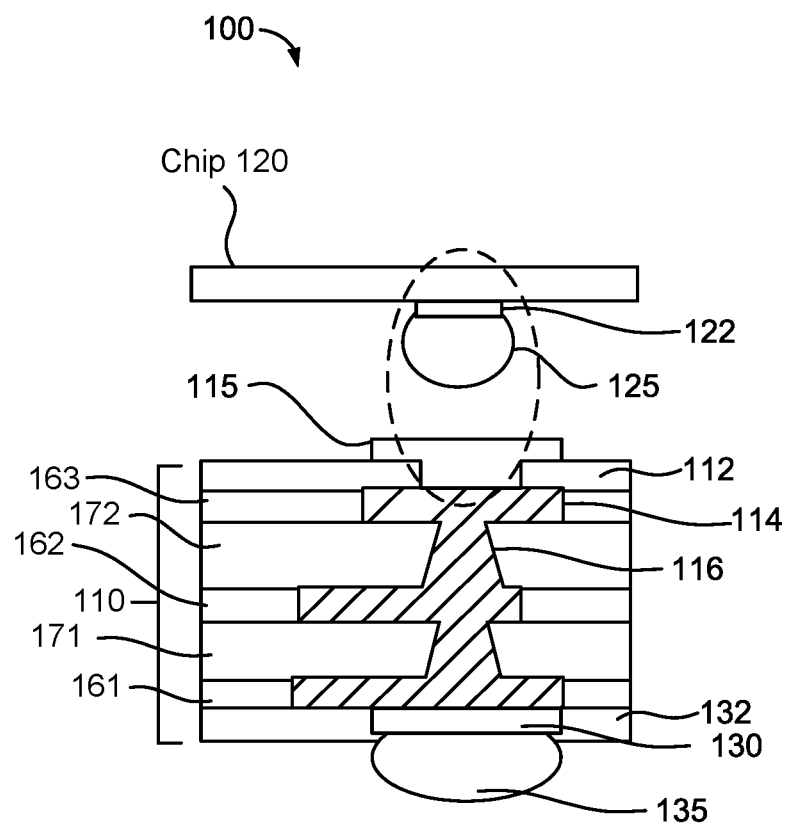
FIG. 1 illustrates a partial cross-sectional view of an interconnection of a flip-chip device.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific aspects. Alternate aspects may be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

FIG. 1 illustrates an exemplary partial side view of a flip-chip device 100. As shown in FIG. 1, a flip-chip device 100 includes a package 110 having a plurality of insulating layer (171 and 172) and metal layers (161, 162 and 163). The various metal layers 161, 162 and 163 can be interconnected using vias, such as via 116. On a backside of the package 110, a ball grid array (BGA) connection may include a BGA pad 130 and a solder ball 135 coupled to the BGA pad 130 through an opening in solder resist 132. The solder ball 135 can be used to connect to the flip-chip device 100 formed of die 120 (also referred to as "chip") and package 110 to external devices, circuitry, etc. The BGA pad 130 and the BGA configuration may be a mixed pad configuration according to various aspects disclosed herein. Additional details regarding the mixed pad BGA configuration will be provided in the following disclosure. On the front side of the package 110 is a bond pad 114, illustrated as a copper bond pad 114. A solder resist layer 112 is formed over the bond pad 114. The solder resist layer 112 can be a photosensitive polymer material having a narrow opening to allow for connection to the bond pad 114. Solder-on-pad (SOP) 115 is provided to fill the opening to facilitate connection to the bond pad 114 in later operations. The SOP 115 can be formed by a solder drop or can be printed with a solder paste and reflow process to fill the opening. As discussed above, the SOP is used to prevent voids in the interconnection of the package 110 to the die 120. The under bump metallization (UBM) 122 of the die 120 is used for connecting the die 120 to the package 110 with solder bump 125 for flip-chip packages. The UBM 122 of the die 120 may be formed of aluminum or copper. It will be appreciated that although only one interconnection between the die 120 and package 110 is illustrated, a plurality of interconnections are used for the flip-chip device 100.

Figure 2:
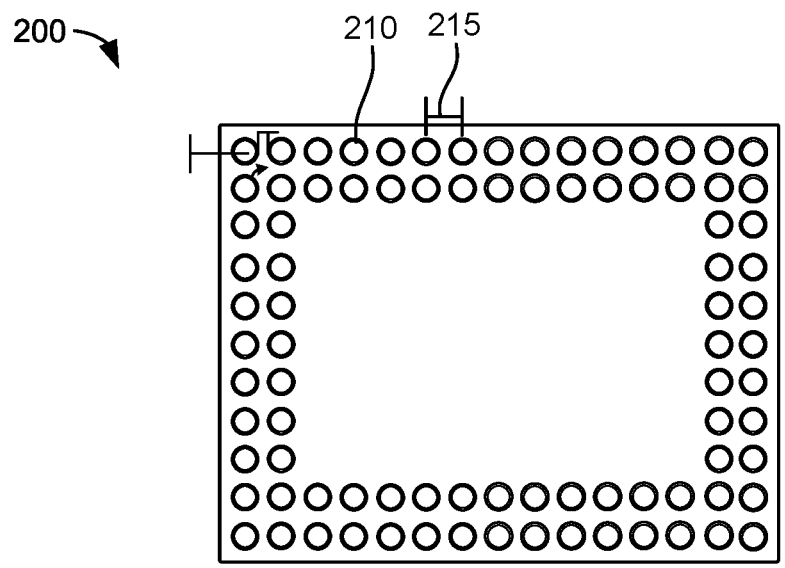
FIG. 2 illustrates a partial image of a conventional design for a package based on conventional design rules.

FIG. 2 illustrates a partial image of a conventional design for a package 200. As discussed above, current package designs use uniform BGA pads 210 size and pitch 215 across the whole package 200. Additionally, in the conventional designs, the uniform BGA pads 210 use uniform solder mask defined (SMD) pad design.

Figure 3:
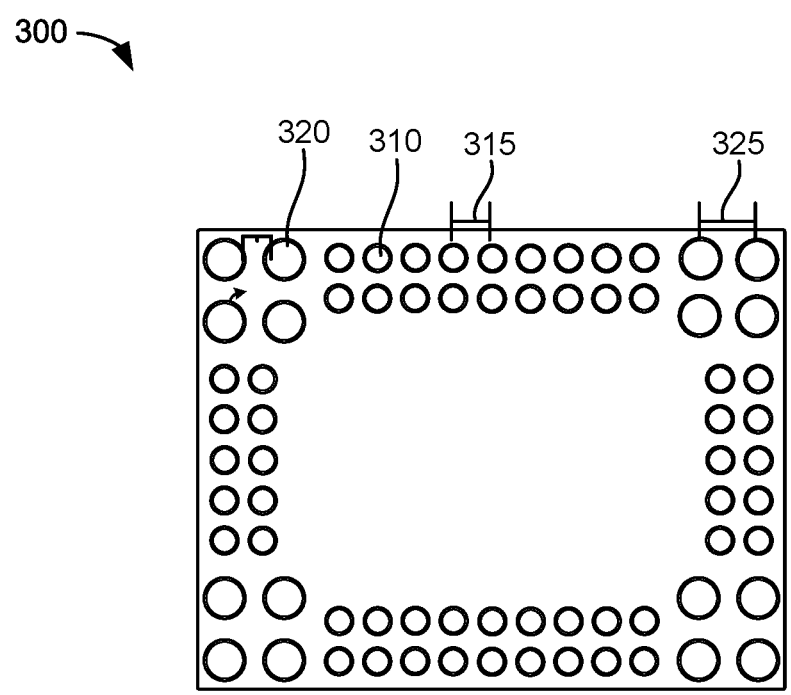
FIG. 3 illustrates a partial image of a design for a package in accordance with some examples of the disclosure.

FIG. 3 illustrates a partial image of a package 300 based according to various aspects of the disclosure. In contrast to the conventional designs, the package 300 is configured to have a mixed pad pitch and pad design. In the illustrated example, a set of first BGA pads 310 may have a first pitch 315 and a first size (e.g., diameter). A set of second BGA pads 320 may have a second pitch 325 and a second size (e.g., diameter). The first BGA pads 310 and second BGA pads 320 may be copper (Cu), or other conductive materials with high conductivity such as silver (Ag), gold (Au), aluminum (Al) and other like materials, alloys or combination of materials. Further, it will be appreciated that the various aspects are not limited to the illustrated patterns or to only two different pitches or sizes, as additional pitches and sizes may be defined in some aspects.

It will be appreciated that the first BGA pads 310 are smaller in size (e.g., diameter) in comparison to the second of BGA pads 320. In some examples, the second BGA pads 320 may be on the order of 10% to 100% larger than the first BGA pads 310. Likewise, the second pitch 325 will be larger than the first pitch 315 and may be on the order of 10% to 100% larger than the first pitch. It will be appreciated that there may be a proportional increase in the pitch as the BGA pad size increases. However, various design considerations, such as pad density, pad to pad spacing, bottom routing and signal integrity may impact the ultimate size and pitch for a given design. Additionally the pad design may be different for each of the first BGA pads 310 (e.g., SMD pad design) and second BGA pads 320 (e.g., non-solder mask defined (NSMD) pad design), as discussed in the following. It will be appreciated that the mixed pad configuration according to the various aspects disclosed allow for variations in at least one of pad size, location or pitch to provide for greater design control. In some aspects, the first set of pads and the second set of pads are formed in a first metal layer of the package, which may be on a front side or a back side of the package of the package. The package, in some aspects, may include a plurality of conductive layers and insulating layers. Further, it will be appreciated that the various aspects disclosed herein may be used in single sided BGA packages and double-sided BGA packages.

It will be appreciated that the aforementioned aspects are merely provided as examples and the various aspects claimed are not limited to the specific references and/or illustrations provided. For example, it will be appreciated that the number, location and/or size of the BGA pads 310 and 320 may be different than the illustrated examples and that these illustrations are provided merely to aid in the explanation of the various aspects disclose herein.

Figure 4:
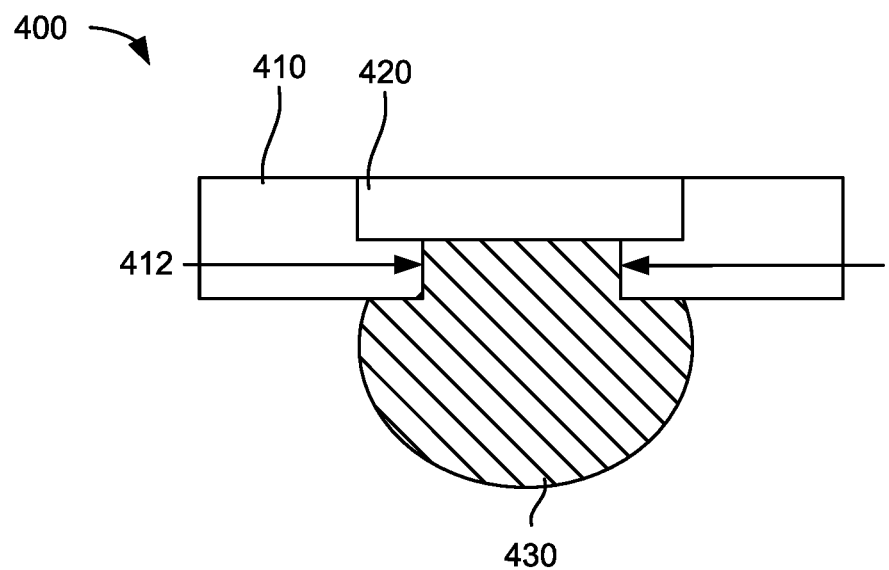
FIG. 4 illustrates a partial image of a design for a package in accordance with some examples of the disclosure.

FIG. 4 illustrates details of a SMD pad design according to various aspects of the disclosure. As illustrated in FIG. 4, the solder resist 410 has an overlay over a portion of the BGA pad 420. The solder resist opening (SRO) 412 is smaller than the BGA pad 420 and allows access to the BGA pad 420 through the solder resist 410. Specifically, connection structure 430 is coupled to the BGA 420 during fabrication of the package. The connection structure 430 may be a solder ball or any suitable conductive structure for forming an electrical connection. It will be appreciated that the solder resist 410 may be any suitable material such as epoxy, liquid photoimageable ink, dry film photoimageable solder mask, and the like. Further, as noted above, the BGA pad 420 may be copper (Cu), or other conductive materials with high conductivity such as silver (Ag), gold (Au), aluminum (Al) and other like materials, alloys or combination of materials. Further, it will be appreciated that the aforementioned aspects are merely provided as examples and the various aspects claimed are not limited to the specific references and/or simplified illustrations provided.

Figure 5:
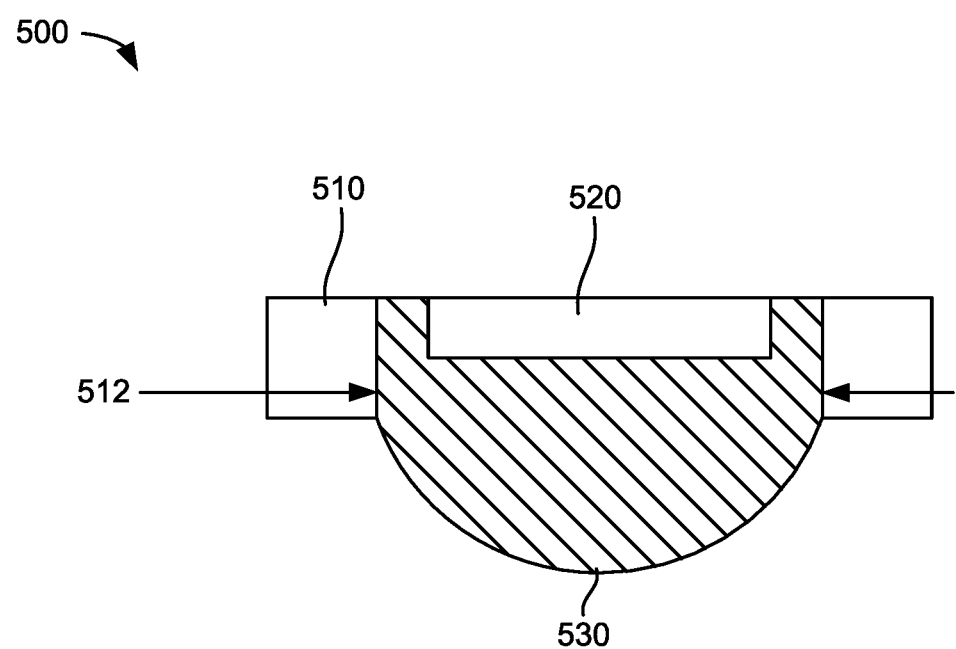
FIG. 5 illustrates a partial image of a design for a package in accordance with some examples of the disclosure.

FIG. 5 illustrates details of a NSMD pad design 500 according to various aspects of the disclosure. As illustrated in FIG. 5, the solder resist 510 has no overlay portion over the BGA pad 520. The solder resist opening (SRO) 512 is larger than the BGA pad 520. The SRO 512 allows access to the BGA pad 520 through the solder resist 510, including access to the sides of the BGA pad 520. Specifically, connection structure 530 is coupled to the BGA 520 during fabrication of the package and in some examples the connection structure 530 can make contact with the entire bottom surface (surface facing the SRO 512) and sides of the BGA pad 520. In contrast to the SMD pad design illustrated in FIG. 4, where contact is only on a portion of the bottom surface of the BGA pad 420, since the SRO 412 is smaller than the BGA pad 420.

The connection structure 530 may be a solder ball or any suitable conductive structure for forming an electrical connection. Further, as noted above, it will be appreciated that the solder resist 510 may be any suitable material such as epoxy, liquid photoimageable ink, dry film photoimageable solder mask, and the like. Likewise, the BGA pad 520 may be copper (Cu), or other conductive materials with high conductivity such as silver (Ag), gold (Au), aluminum (Al) and other like materials, alloys or combination of materials. It will be appreciated that these examples are provided solely for illustration and the SRO 512 increase may be greater or less than the example illustrated. Further, it will be appreciated that real world design constraints, such as minimum pitch spacing, number of BGA pads 520 used, fabrication limitations, etc., are design considerations that may impact the size, number, location, pitch, material, etc. of the various components illustrated.

Figure 6:
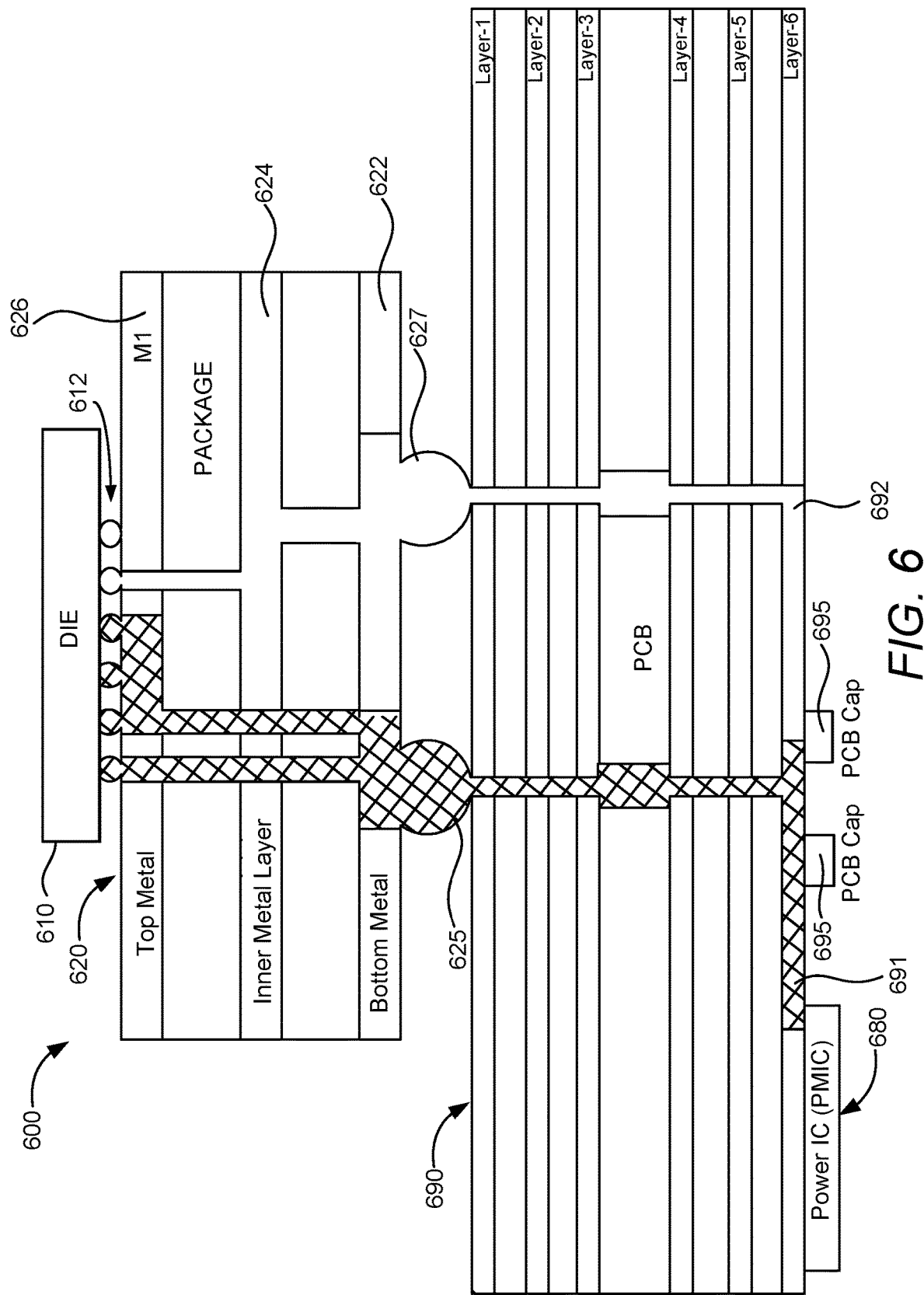
FIG. 6 illustrates components of an integrated device according to one or more aspects of the disclosure.

FIG. 6 illustrates components of an integrated device 600 according to one or more aspects of the disclosure. Regardless of the various configurations of the packages (e.g., package 300) discussed above, it will be appreciated that the package 620 may be configured to couple the die 610 to a PCB 690. The PCB 690 is also coupled to a power supply 680 (e.g., a power management integrated circuit (PMIC)), which allows the package 620 and the die 610 to be electrically coupled to the PMIC 680. Specifically, one or more power supply (VDD) lines 691 and one or more ground (GND) lines 692 may be coupled to the PMIC 680 to distribute power to the PCB 690, package 620 via VDD BGA ball 625 and GND BGA ball 627 and to the die 610 via die bumps 612. It will be appreciated that more BGA balls may be provided in addition the illustrated BGA balls 625 and 627. Further, it will be appreciate that these BGA balls may be attached to a mixed pad in the package 620, according to one or more aspects disclosed herein. The VDD line 691 and GND line 692 each may be formed from traces, shapes or patterns in one or more metal layers of the PCB 690 (e.g., layers 1-6) coupled by one or more vias through insulating layers separating the metal layers 1-6 in the PCB 690. The PCB 690 may have one or more PCB capacitors (PCB cap) 695 that can be used to condition the power supply signals, as is known to those skilled in the art. Additional connections and devices may be coupled to and/or pass through the PCB 690 to the package 620 via one or more additional BGA balls (not illustrated) on the package 620. It will be appreciated that the illustrated configuration and descriptions are provided merely to aid in the explanation of the various aspects disclosed herein. For example, the PCB 690 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes a package (e.g., 300) including a first set of pads (e.g., 310) having a first size and a first pitch (e.g., 315). The first set of pads may be solder mask defined (SMD) pads. The package further includes a second set of pads (e.g., 320) having a second size and a second pitch (e.g., 325). The second set of pads may be non-solder mask defined (NSMD) pads. Among the various technical advantages the various aspects disclosed provide, in at least some aspects, a package with mixed pad size, spacing and/or pitch allows for package performance and reliability, by providing larger pads (e.g., the second set of pads 320) which may be NSMD pads for power and RF analog signals and still have smaller pads (e.g., first set of pads 310) which may be SMD pads with increased pad density (e.g., smaller pitch 315) for other signaling which is not available in conventional designs.

Figure 7:
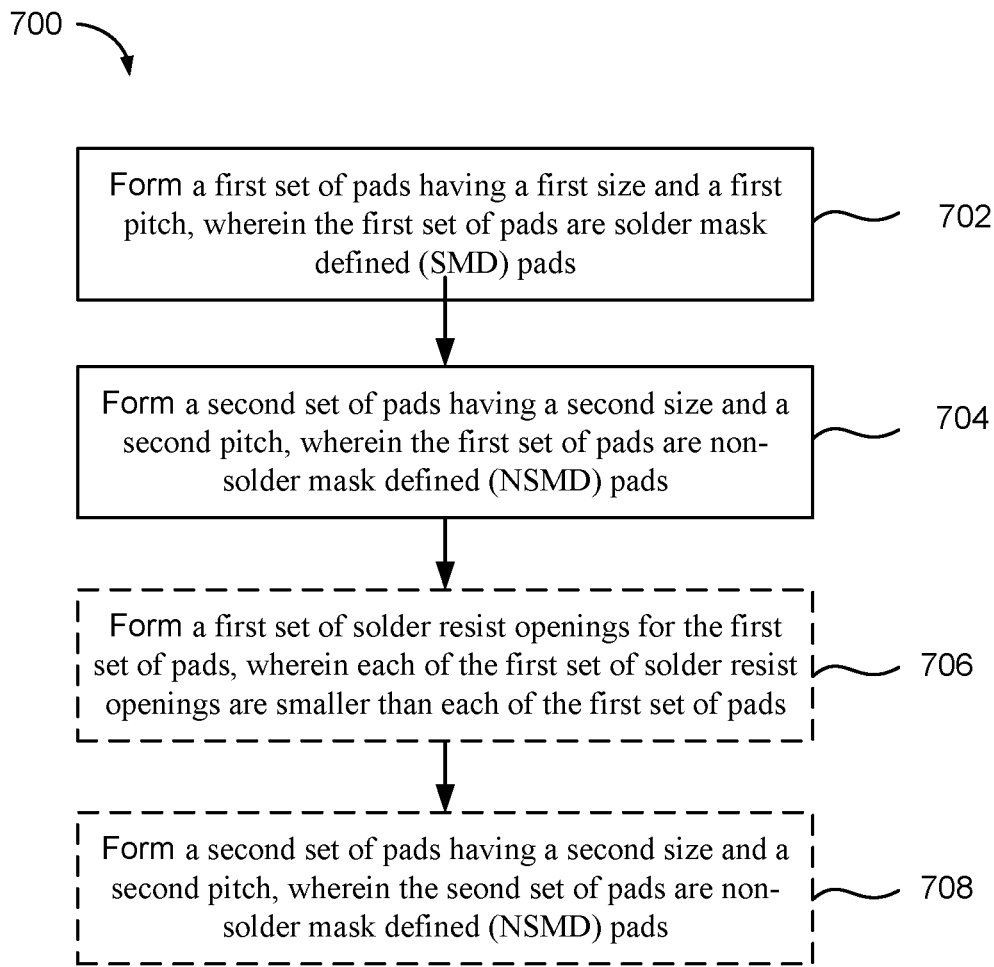
FIG. 7 illustrates a flowchart of a method for manufacturing a package in accordance with some examples of the disclosure.

It will be appreciated from the foregoing that there are various methods for fabricating the devices disclosed herein. FIG. 7 illustrates a flowchart of a method 700 for fabricating a package (e.g., 300 in FIG. 3) in accordance with some examples of the disclosure. As shown in FIG. 7, the partial method 700 may begin in block 702 with forming a first set of pads having a first size and a first pitch, wherein the first set of pads are solder mask defined (SMD) pads. The partial method 700 may continue in block 704 with forming a second set of pads having a second size and a second pitch, wherein the second set of pads are non-solder mask defined (NSMD) pads. Then, optionally, the partial method 700 may continue in block 706 with forming a first set of solder resist openings for the first set of pads, wherein each of the first set of solder resist openings are smaller than each of the first set of pads. The partial method 700 may optionally continue in block 708 with forming a second set of solder resist openings for the second set of pads, wherein each of the second set of solder resist openings are larger than each of the second set of pads. Additionally, as noted above each pad of the second set of pads may be larger than each pad of the first set of pads. As discussed in the foregoing, the various sized pads can be formed using similar fabrication processes and materials. It will be appreciated from the foregoing disclosure that additional processes for fabricating the various aspects disclosed herein will be apparent to those skilled in the art and a literal rendition of the processes discussed above will not be provided or illustrated in the included drawings.

Figure 8:
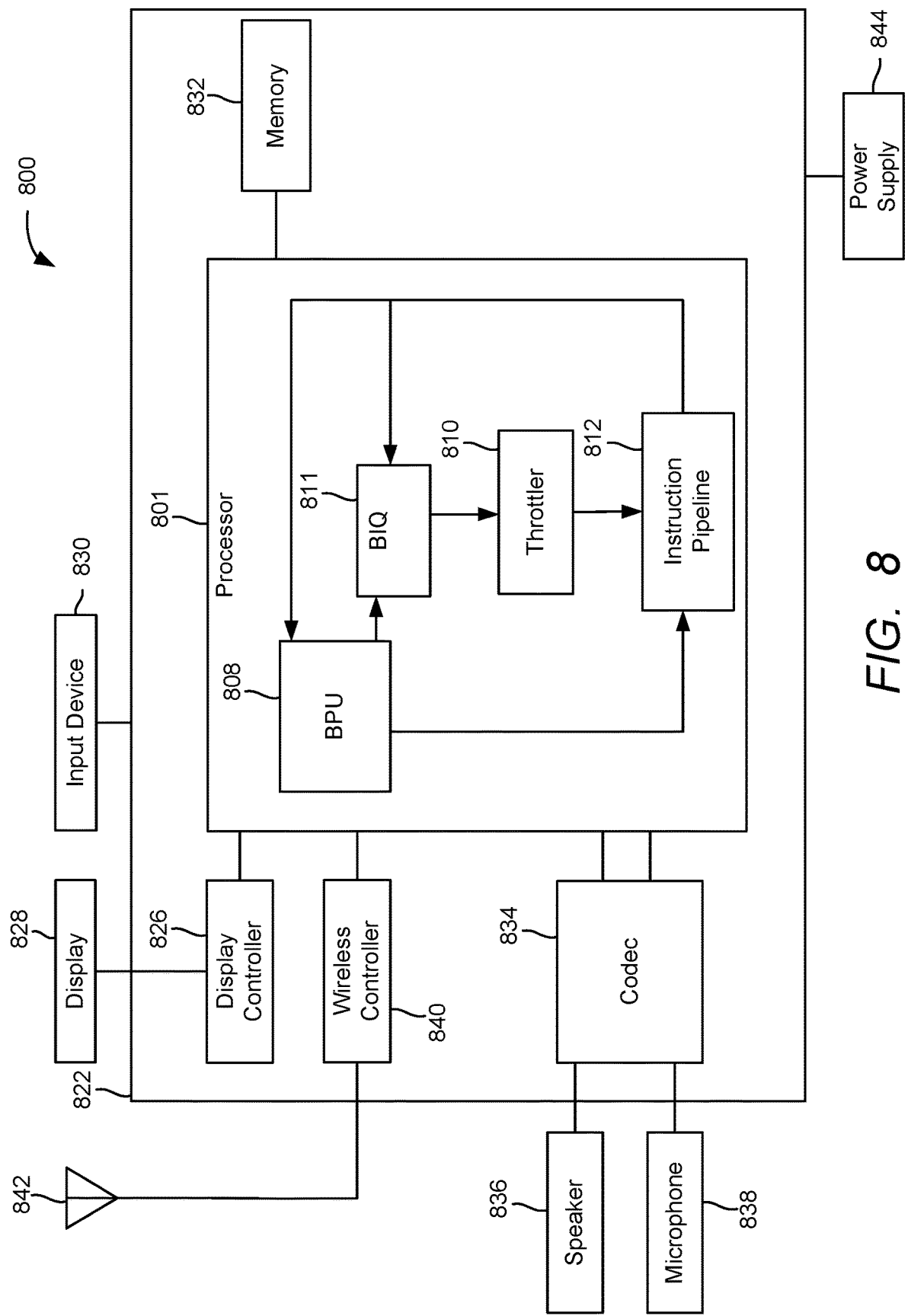
FIG. 8 illustrates an exemplary mobile device in accordance with some examples of the disclosure.

FIG. 8 illustrates an exemplary mobile device in accordance with some examples of the disclosure. Referring now to FIG. 8, a block diagram of a mobile device that is configured according to exemplary aspects is depicted and generally designated mobile device 800. In some aspects, mobile device 800 may be configured as a wireless communication device. As shown, mobile device 800 includes processor 801. Processor 801 is shown to comprise instruction pipeline 812, buffer processing unit (BPU) 808, branch instruction queue (BIQ) 811, and throttler 810 as is well known in the art. Other well-known details (e.g., counters, entries, confidence fields, weighted sum, comparator, etc.) of these blocks have been omitted from this view of processor 801 for the sake of clarity. Processor 801 may be communicatively coupled to memory 832 over a link, which may be a die-to-die or chip-to-chip link. Mobile device 800 also includes display 828 and display controller 826, with display controller 826 coupled to processor 801 and to display 828.

In some aspects, FIG. 8 may include coder/decoder (CODEC) 834 (e.g., an audio and/or voice CODEC) coupled to processor 801; speaker 836 and microphone 838 coupled to CODEC 834; and wireless circuit 840, which may include a modem, RF circuitry, filters, etc., which may be implemented using one or more packages with mixed pads, as disclosed herein. In some aspects, the mixed pad package may be used in RFFE component(s). The wireless circuit 840 is coupled to wireless antenna 842 and to processor 801.

In a particular aspect, where one or more of the above-mentioned blocks are present, processor 801, display controller 826, memory 832, CODEC 1234, and wireless circuit 840 can be included in a system-in-package or system-on-chip device 822 which may be implemented in whole or part using the mixed pad package designs disclosed herein. Input device 830 (e.g., physical or virtual keyboard), power supply 844 (e.g., battery), display 828, input device 830, speaker 836, microphone 838, wireless antenna 842, and power supply 844 may be external to system-on-chip device 822 and may be coupled to a component of system-on-chip device 822, such as an interface or a controller.

It should be noted that although FIG. 8 depicts a mobile device, processor, memory and other components may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 9:
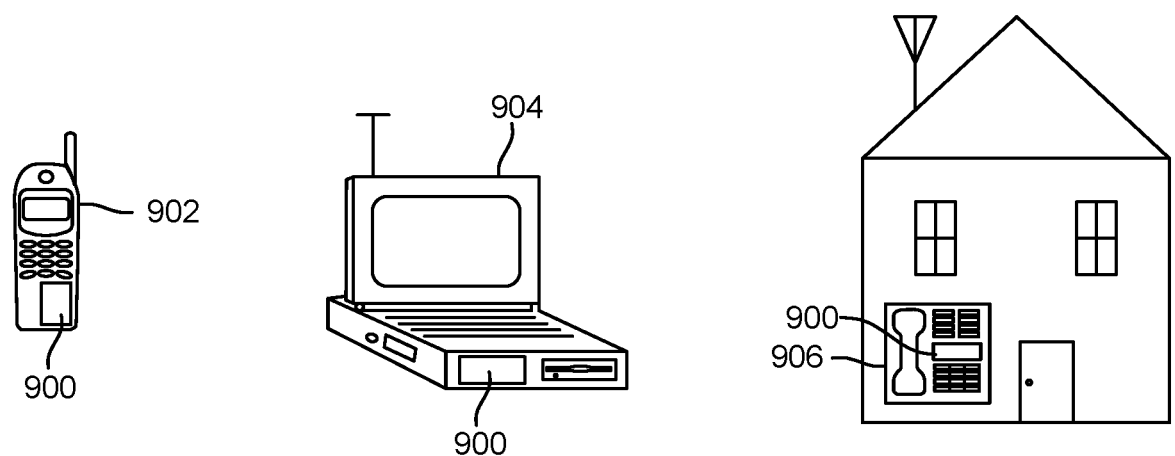
FIG. 9 illustrates various electronic devices which may include a mixed pad size in accordance with various examples of the disclosure.

FIG. 9 illustrates various electronic devices that may be integrated with any of the aforementioned devices or semiconductor devices in accordance with various examples of the disclosure. For example, a mobile phone device 902, a laptop computer device 904, and a fixed location terminal device 906 may each be consider generally user equipment (UE) and may include a package 900, including a mixed pad design as described herein. The package 900 may be, for example, at least part of any of the integrated circuits, dies, integrated devices, integrated device packages, integrated circuit devices, device packages, integrated circuit (IC) packages, package-on-package devices described herein. The devices 902, 904, 906 illustrated in FIG. 9 are merely exemplary. Other electronic devices may also feature the package 900 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS) Gerber, and the like) stored on computer-readable media. Some or all such files may be provided to fabrication handlers who fabricate devices based on such files. Resulting products may include semiconductor wafers that are then cut into semiconductor die and packaged into an integrated device including on or more dies and packages (e.g., flip-chip package). The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-9 may be rearranged and/or combined into a single component, process, feature or function or incorporated in several components, processes, or functions. Additional elements, components, processes, and/or functions may also be added without departing from the disclosure. It should also be noted that FIGS. 1-9 and corresponding description in the present disclosure are not limited to dies and/or ICs. In some implementations, FIGS. 1-9 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in each claim. Rather, the various aspects of the disclosure may include fewer than all features of an individual example disclosed. Therefore, the following claims should hereby be deemed to be incorporated in the description, wherein each claim by itself can stand as a separate example. Although each dependent claim can refer in the claims to a specific combination with one of the other claims, the aspect(s) of that dependent claim are not limited to the specific combination. It will be appreciated that other aspects disclosed can also include a combination of the dependent claim aspect(s) with the subject matter of any other dependent claim or independent claim or a combination of any feature with other dependent and independent claims. The various aspects disclosed herein expressly include these combinations, unless it is explicitly expressed or can be readily inferred that a specific combination is not intended (such as contradictory aspects, where the combination would define an element as two alternative components, materials, etc.). Furthermore, it is also intended that aspects of a claim can be included in any other independent claim(s), even if the claim is not directly dependent on the independent claim(s).

For example, further aspects may include one or more of the following features discussed in the various example aspects. Example aspect 1 includes an apparatus comprising a package, the package comprises: a first set of pads having a first size and a first pitch, wherein the first set of pads are solder mask defined (SMD) pads; and a second set of pads having a second size and a second pitch, wherein the second set of pads are non-solder mask defined (NSMD) pads.

Example aspect 2, which may be combined with the foregoing example aspect 1, includes wherein the first set of pads and the second set of pads are formed in a first metal layer of the apparatus.

Example aspect 3, which may be combined with the foregoing example aspect 2, includes wherein the apparatus is covered by a solder resist with openings over the first set of pads and the second set of pads.

Example aspect 4, which may be combined with the foregoing example aspect 3, further comprises: a first set of solder resist openings for the first set of pads, wherein each of the first set of solder resist openings are smaller than each of the first set of pads.

Example aspect 5, which may be combined with the foregoing example aspects 3 and 4, further comprises: a second set of solder resist openings for the second set of pads, wherein each of the second set of solder resist openings are larger than each of the second set of pads.

Example aspect 6, which may be combined with the foregoing example aspects 1 to 5, includes wherein the first size of the first set of pads are generally uniform and smaller than the second size of the second set of pads.

Example aspect 7, which may be combined with the foregoing example aspect 6, includes wherein each of the second set of pads is between 10% and 100% larger than each of the first set of pads.

Example aspect 8, which may be combined with the foregoing example aspects 1 to 7, includes wherein the first pitch of the first set of pads are generally uniform and smaller than the second pitch of the second set of pads.

Example aspect 9, which may be combined with the foregoing example aspect 8, includes wherein the second pitch is between 10% and 100% larger than each of the first pitch.

Example aspect 10, which may be combined with the foregoing example aspects 1 to 10, includes wherein the apparatus is a single sided ball grid array (BGA) package or a double-sided ball grid array (BGA) package.

Example aspect 11, which may be combined with the foregoing example aspects 1 to 11, wherein the apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Example aspect 12 includes method for fabricating a package, the method comprising: forming a first set of pads having a first size and a first pitch, wherein the first set of pads are solder mask defined (SMD) pads; and forming a second set of pads having a second size and a second pitch, wherein the second set of pads are non-solder mask defined (NSMD) pads.

Example aspect 13, which may be combined with the foregoing example aspect 12, includes, wherein the first set of pads and the second set of pads are formed in a first metal layer of the package.

Example aspect 14, which may be combined with the foregoing example aspects 12 and 13, includes, wherein the package is covered by a solder resist with openings over the first set of pads and the second set of pads.

Example aspect 15, which may be combined with the foregoing example aspect 14, further comprises: forming a first set of solder resist openings for the first set of pads, wherein each of the first set of solder resist openings are smaller than each of the first set of pads.

Example aspect 16, which may be combined with the foregoing example aspects 14 and 15, further comprises: forming a second set of solder resist openings for the second set of pads, wherein each of the second set of solder resist openings are larger than each of the second set of pads.

Example aspect 17, which may be combined with the foregoing example aspects 12 to 16, includes wherein the first size of the first set of pads are generally uniform and smaller than the second size of the second set of pads.

Example aspect 18, which may be combined with the foregoing example aspect 17, includes wherein each of the second set of pads is between 10% and 100% larger than each of the first set of pads.

Example aspect 19, which may be combined with the foregoing example aspects 12 to 18, includes wherein the first pitch of the first set of pads are generally uniform and smaller than the second pitch of the second set of pads.

Example aspect 20, which may be combined with the foregoing example aspect 19, includes wherein each of the second pitch is between 10% and 100% larger than each of the first pitch.

Example aspect 21, which may be combined with the foregoing example aspects 12 to 20, includes wherein the package is a single sided ball grid array (BGA) package or double-sided ball grid array (BGA) package.

Example aspect 21, which may be combined with the foregoing example aspects 12 to 21, includes wherein the package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a package, the package comprising:
    a first set of pads having a first size and a first pitch, wherein the first set of pads are solder mask defined (SMD) pads; and
    a second set of pads having a second size different from the first size and a second pitch different from the first pitch, wherein the second set of pads are non-solder mask defined (NSMD) pads,
    wherein the first pitch is a center to center distance between adjacent pads of the first set of pads and the second pitch is a center to center distance between adjacent pads of the second set of pads,
    wherein the first size of the first set of pads are generally uniform and smaller than the second size of the second set of pads, and
    wherein one or more pads of the first set of pads occupy an outermost perimeter of the package.

2. The package of claim 1, wherein the first set of pads and the second set of pads are formed in a first metal layer of the apparatus.

3. The package of claim 2, wherein the apparatus is covered by a solder resist with openings over the first set of pads and the second set of pads.

4. The apparatus of claim 3, further comprising:
    a first set of solder resist openings for the first set of pads, wherein each of the first set of solder resist openings are smaller than each of the first set of pads.

5. The package of claim 3, further comprising:
a second set of solder resist openings for the second set of pads, wherein each of the second set of solder resist openings are larger than each of the second set of pads.

6. The apparatus of claim 1, wherein each of the second set of pads is between 10% and 100% larger than each of the first set of pads.

7. The package of claim 1, wherein the first pitch of the first set of pads are generally uniform and smaller than the second pitch of the second set of pads.

8. The apparatus of claim 7, wherein the second pitch is between 10% and 100% larger than each of the first pitch.

9. The package of claim 1, wherein the apparatus is a single sided ball grid array (BGA) package or a double-sided ball grid array (BGA) package.

10. The apparatus of claim 1, wherein the apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. A method for fabricating a package, the method comprising:
forming a first set of pads having a first size and a first pitch, wherein the first set of pads are solder mask defined (SMD) pads; and
forming a second set of pads having a second size different from the first size and a second pitch different from the first pitch, wherein the second set of pads are non-solder mask defined (NSMD) pads,
wherein the first pitch is a center to center distance between adjacent pads of the first set of pads and the second pitch is a center to center distance between adjacent pads of the second set of pads,
wherein the first size of the first set of pads are generally uniform and smaller than the second size of the second set of pads, and
wherein one or more pads of the first set of pads occupy an outermost perimeter of the package.

12. The method of claim 11, wherein the first set of pads and the second set of pads are formed in a first metal layer of the package.

13. The method of claim 12, wherein the package is covered by a solder resist with openings over the first set of pads and the second set of pads.

14. The method of claim 13, further comprising:
forming a first set of solder resist openings for the first set of pads, wherein each of the first set of solder resist openings are smaller than each of the first set of pads.

15. The method of claim 13, further comprising:
forming a second set of solder resist openings for the second set of pads, wherein each of the second set of solder resist openings are larger than each of the second set of pads.

16. The method of claim 11, wherein each of the second set of pads is between 10% and 100% larger than each of the first set of pads.

17. The method of claim 11, wherein the first pitch of the first set of pads are generally uniform and smaller than the second pitch of the second set of pads.

18. The method of claim 17, wherein each of the second pitch is between 10% and 100% larger than each of the first pitch.

19. The method of claim 11, wherein the package is a single sided ball grid array (BGA) package or a double-sided ball grid array (BGA) package.

20. The method of claim 11, wherein the package is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

21. The package of claim 5, further comprising:
a second set of connection structures configured to couple with the second set of pads,
wherein at least one of the second set of set of connection structures in contact with sides of the solder resist of the corresponding one of the second set of solder resist opening.

22. The method of claim 15, further comprising:
forming a second set of connection structures configured to couple with the second set of pads,
wherein at least one of the second set of set of connection structures in contact with sides of the solder resist of the corresponding one of the second set of solder resist opening.

* * * * *